United States Patent
Kumar et al.

(10) Patent No.: US 11,056,164 B2
(45) Date of Patent: Jul. 6, 2021

(54) CIRCUITS TO CONTROL OUTPUT SIGNAL VARIABILITY

(71) Applicant: Arm Limited, Cambridge (GB)

(72) Inventors: Akshay Kumar, Noida (IN); El Mehdi Boujamaa, Valbonne (FR); Cyrille Nicolas Dray, Antibes (FR)

(73) Assignee: Arm Limited, Cambridge (GB)

( * ) Notice: Subject to any disclaimer, the term of this patent is extended or adjusted under 35 U.S.C. 154(b) by 9 days.

(21) Appl. No.: 16/268,427

(22) Filed: Feb. 5, 2019

(65) Prior Publication Data
US 2020/0251156 A1 Aug. 6, 2020

(51) Int. Cl.
*G11C 11/16* (2006.01)

(52) U.S. Cl.
CPC ...... *G11C 11/1675* (2013.01); *G11C 11/1659* (2013.01)

(58) Field of Classification Search
CPC .......................... G11C 11/1675; G11C 11/1659
See application file for complete search history.

(56) References Cited

U.S. PATENT DOCUMENTS

| | | | | |
|---|---|---|---|---|
| 2002/0158700 A1* | 10/2002 | Nemoto | ................. | H03B 5/323 331/158 |
| 2009/0238239 A1* | 9/2009 | Pan | ......................... | G01K 7/01 374/178 |
| 2011/0026303 A1* | 2/2011 | Choi | ........................ | G11C 7/04 365/148 |
| 2011/0078538 A1* | 3/2011 | Ikegawa | ............. | G11C 11/1675 714/758 |
| 2016/0238462 A1* | 8/2016 | Geiger | .................. | G01K 13/00 |

* cited by examiner

*Primary Examiner* — Mohammed A Bashar
(74) *Attorney, Agent, or Firm* — Pramudji Law Group PLLC; Ari Pramudji

(57) ABSTRACT

Briefly, embodiments of claimed subject matter relate to circuits and methods for providing signals, such as signals to bring about writing of binary logic values to magnetic random-access memory (MRAM) cells. In particular embodiments, such circuits may operate to control output signal variability over an operating temperature range.

20 Claims, 7 Drawing Sheets

700

800

CIRCUITS TO CONTROL OUTPUT SIGNAL VARIABILITY

TECHNICAL FIELD

This disclosure relates to circuits and methods for providing signals to memory cells, wherein such circuits operate to control output signal variability as a function of process, voltage, and/or temperature.

BACKGROUND

In computing devices, which may include devices such as general-purpose hand-held computers, gaming devices, communications devices, smart phones, embedded or special-purpose computing systems, an array of memory cells may be utilized to store instructions, for example, for use by one or more processors of the computing device. Such computing devices may utilize various memory technologies, such as random-access memory (RAM) arrays, to store instructions executable by a processor and/or to store any results of such execution. In such memory arrays, a binary logic value of "1" or a binary logic value of "0," may be determined at a bit line of a cell of a RAM in response to a voltage being applied to the gate of one or more access transistors of the cell of the RAM array.

However, when utilizing certain types of memory arrays, such as arrangements of magnetic random-access memory (MRAM) cells, a signal utilized to perform memory write operations may be required to increase or decrease in amplitude in a manner that is at least partially dependent upon an ambient temperature of individual memory cells of the memory array. Thus, for example, at a relatively low ambient temperature, a MRAM cell may require a greater current to perform write operations than a MRAM cell operating at a relatively high ambient temperature. Additionally, within at least certain ranges of ambient temperature, signals utilized to perform write operations to MRAM cells may be limited to particular upper boundaries so as to preclude damaging a MRAM cell. It may thus be appreciated that providing signal sources that bring about writing operations to MRAM cells over a wide variety of ambient temperature ranges, without exceeding specified limits, continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

Figure 1A:
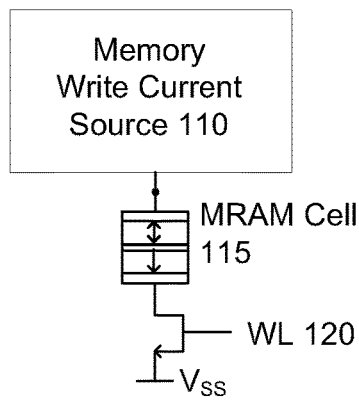
FIG. 1A is a block diagram of a current source utilized to perform write operations involving a MRAM cell according to various embodiments.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously mentioned, in a computing device, which may include a device such as a general-purpose hand-held computer, a gaming device, a communications device, a smart phone, an embedded or special-purpose computing system, an array of memory cells may be utilized to store instructions for use by one or more processors of the computing device. In such memory devices, a state of a memory cell, such as a binary logic value of "1" or a binary logic value of "0," may be determined at a bit line of a memory cell in response to a signal being applied at the gate of one or more access transistors of the memory cell. In particular types of memory devices, binary logic values may be encoded into individual memory cells according to a resistive state of an individual memory cell. Thus, in one instance, a relatively high resistance of a resistive memory cell may indicate storage of a binary logic value of "1," while a relatively low resistance of a resistive memory cell may indicate storage of a binary logic value of "0." It should be noted, however, that such correspondence between binary logic values and resistive states of memory cells is arbitrary, and claimed subject matter is not limited in this respect.

For certain memory technologies, such as MRAM utilizing magnetic tunneling junctions (MTJs), binary logic values may be stored in a MRAM cell according to a direction of a magnetization vector of a first localized region of the MRAM cell relative to a second localized region of the MRAM cell. For example, storage of a first binary logic value, such as a "1," may correspond to a magnetization vector of the first localized region being substantially parallel to the magnetization vector of the second localized region. Storage of a second binary logic value, such as a "0," may correspond to a magnetization vector of the first localized region being substantially parallel to a magnetization vector of the second localized region. In MRAM systems utilizing (MTJs), reorientation of magnetization vectors of localized regions may be brought about by coupling a signal, such as an electric current signal conducted through the first localized region, having sufficient magnitude so as to reverse the magnetization vector of the first localized region.

However, in certain types of MRAM cells, such as MRAM cells utilizing MTJs, an electric current sufficient to bring about a write operation, which may give rise to reorientation of a magnetization vector of a first localized region with respect to a second localized region, may be dependent upon the temperature of the a memory cell. For example, in a MRAM cell utilizing a tunneling junction, performing write operations at relatively low temperatures, such as temperatures of −40.0° C., may involve use of a signal, such as a signal comprising an electric current, having an amplitude that is considerably higher than the amplitude of a signal utilized to perform write operations at relatively high temperatures, such as temperatures of +125.0° C. In particular types of MRAM cells, signals utilized to perform write operations over temperature ranges of interest may vary by up to 50.0%, or more. The claimed subject matter herein is intended to embrace all variations in amplitude of signals utilized to perform write operations to MRAM cells.

Further, within certain ranges of ambient temperature, signal amplitudes utilized to perform write operations to MRAM cells utilizing tunneling junctions may be limited to particular upper boundaries. Write operations to MRAM cells performed utilizing signal amplitudes above particular upper boundaries may bring about damage to MRAM cells, such as shorting of a MRAM cells, for example. Thus, it may be appreciated that a premium may be placed on providing signal sources that enable reliable write operations involving resistive memory cells, such as MRAM cells, over a wide variety of ambient temperature ranges but without exceeding device limits.

Accordingly, in a particular embodiment of claimed subject matter, a circuit may include circuitry for generating signals that are proportional to ambient temperature (PTAT). Those signals may correspond to electric currents. The circuit may additionally include circuitry for generating signals that are complementary to ambient temperature (CTAT). Another circuit, which may operate as a summing circuit, may combine signals from the PTAT and CTAT circuits to form a signal that aligns with at least one of the signal-versus-temperature limits of a resistive memory cell. Accordingly, in certain embodiments, signals may be generated to give rise to a capability for writing to a MRAM cell, such as a MTJ memory cell, over a wide variety of operating ambient temperatures, such as temperatures ranging from about −40.0° C. to about +125.0° C. In certain embodiments, over such operating temperature ranges, electric currents may be generated so as to reliably perform write operations involving MRAM cells without permitting memory cells to consume excessive current that may bring about damage to MRAM cells.

In particular embodiments, a summing circuit, which may receive signals which are PTAT and CTAT, may provide a capability to apply a greater weight, for example, to a CTAT signal with respect to a PTAT signal. Accordingly, via such weighting of a CTAT with respect to a PTAT signal, a signal-versus-temperature profile may be generated, which may align with upper and lower limits of electric current involved performing write operations to MRAM cells. In certain embodiments, circuitry for generating CTAT signals may utilize a parallel combination of an N-diode and a P-diode, which (as described further herein) may operate to allow conduction of an electrical current, such as through a P-diode, even when a N-diode is unable to conduct a sufficient electrical current. Such parallel combining of an N-diode and a P-diode in circuitry for generating CTAT signals may bring about an ability to conduct a sufficient electric current (or other type of signal) even when carrier mobility of N-diodes and P-diodes operates at different process corners that characterize PMOS and NMOS transistor devices. Such process corners may include slow NMOS/fast PMOS (SF), fast NMOS/fast PMOS (FF) corners. Other process corners, which may refer to carrier mobilities that do not differ significantly from one another, may include slow NMOS/slow PMOS (SS), fast NMOS/slow PMOS (FS) and typical/typical (TT) process corners.

In certain embodiments, additional control over write signals to MRAM cells may be provided via adaptively body-biasing transistors utilized in, for example, circuitry for generating CTAT signals. As described further herein, such body-biasing of transistors may bring about an ability to generate signals that are substantially invariant with respect to operating temperatures, such as temperatures from about −40.0° C. to about +125.0° C. In certain embodiments, generation of signals that are substantially invariant with respect to operating temperatures may be achieved via implementing a depleted silicon-on-insulator device, which permits a high level of control over a turn-on voltage of transistors utilized in circuitry for generating CTAT signals. It may follow that such control over turn-on voltage may also bring about an ability to generate signals that are substantially invariant of ambient operating temperatures, such as from about −40.0° C. to about +125.0° C.

Before discussing various embodiments in reference to the accompanying figures, a brief description of various nonlimiting embodiments is provided in the following paragraphs. For example, a particular embodiment may be directed to a circuit, having a first circuit to generate a first signal that exhibits a first characteristic that is proportional to ambient temperature. The circuit may additionally include a second circuit to generate a second signal that exhibits a second characteristic that is complementary to ambient temperature. The circuit may further include a third circuit to generate a combined signal based, at least in part, on the first signal and on the second signal, wherein the combined signal exhibits a combined characteristic that is in alignment with a signal-versus-temperature limit of a resistive memory cell. In an embodiment, the above-described circuit may include a second circuit, wherein the second circuit includes at least one PMOS transistor having a fully depleted layer of silicon-on-insulator (FDSOI). In particular embodiments, the first characteristic, the second characteristic, and the combined characteristic of the above-described circuit may refer to an electric current. In an embodiment, the third circuit may exhibit a capability to conduct an electric current generated by the second circuit that is weighted with respect to an electric current generated by the first circuit. In an embodiment, the third circuit of the above-described circuit may generate a combined signal having an amplitude that varies by less than about 20.0% over a temperature range of about −40.0° C. to about +125.0° C.

In one embodiment, the second circuit of the above-described circuit that generates the second signal may include a parallel combination of an N-diode and a P-diode, wherein the parallel combination is coupled to an output node of the second circuit. The signal-versus-temperature limit of the resistive memory cell of the above-described circuit may correspond to an upper current limit or a lower current limit, wherein a write operation may occur between the upper current limit and the lower current limit. The resistive memory cell of the above-described circuit may correspond to a MRAM cell, such as a (MTJ) cell. In one embodiment, the MRAM cell may be coupled to the third circuit through at least two write paths.

In another embodiment, a circuit may include a summing circuit to obtain an input signal from a first circuit that generates an electric current that varies proportionally to ambient temperature. The summing circuit may additionally obtain an input signal from a second circuit that generates an electric current that varies in a manner complementary to temperature, in which the summing circuit generates a write signal to a memory cell, which may include a MRAM cell (e.g. a MTJ). The summing circuit may additionally apply a weighting function of the input signal from the second circuit with respect to the input signal from the first circuit. The second circuit of the above-identified circuit may include a parallel combination of an N-diode and a P-diode, wherein the parallel combination is coupled to an output node of the second circuit. In one embodiment, the second circuit of the above-described circuit may include at least one PMOS transistor including a fully depleted layer of silicon-on-insulator (FDSOI). In another embodiment, the second circuit of the above-described circuit may include at least one PMOS transistor that is adaptively body-biased.

In one embodiment, a method of fabricating a circuit may include forming a first circuit to generate a first signal that exhibits a first characteristic that is proportional to ambient temperature. The method may additionally include forming a second circuit to generate a second signal that exhibits a second characteristic that is complementary to ambient temperature. The method may further include forming a third circuit to generate a combined signal based, at least in part, on the first signal and on the second signal, wherein the combined signal exhibits a combined characteristic that is substantially invariant with respect to the first signal and the second signal over an ambient temperature range. In an embodiment, the method may additionally include forming one or more instances of MRAM cells for coupling to the third circuit to generate the combined signal. In an embodiment, forming the second circuit to generate the second signal may comprise forming a parallel combination of an N-diode and a P-diode, wherein the parallel combination is coupled to an output node of the second circuit.

Particular embodiments will now be described with reference to the figures, such as FIG. 1, which is a block diagram 100 of a current source utilized in a write operation involving a MRAM cell according to various embodiments. In the embodiment of FIG. 1A, memory write current source 110 may comprise a source capable of providing, for example, between 1.0 μA and 100.0 μA, so as to perform a write operation to a MRAM cell 115. In the embodiment of FIG. 1A, MRAM cell 115 may comprise a MTJ cell, which may store a first binary logic value, such as a "1," responsive to a magnetization vector of a first localized region of MRAM cell 115 being oriented parallel to the magnetization vector of a second localized region. MRAM cell 115 may store a second binary logic value, such as a "0," responsive to the magnetization vector of the first localized region being oriented substantially antiparallel to the magnetization vector of the second localized region. It should be noted, however, that such correspondence between binary logic values and resistive states of memory cells is arbitrary, and claimed subject matter is not limited in this respect. In the embodiment of FIG. 1A, storage of binary values in MRAM cell 115 may be brought about via word line (WL) 120, which may permit an electrical current to conduct through cell 115 responsive to a sufficient voltage being applied to word line 120 in relation to a reference voltage, such as Vss.

Figure 1B:
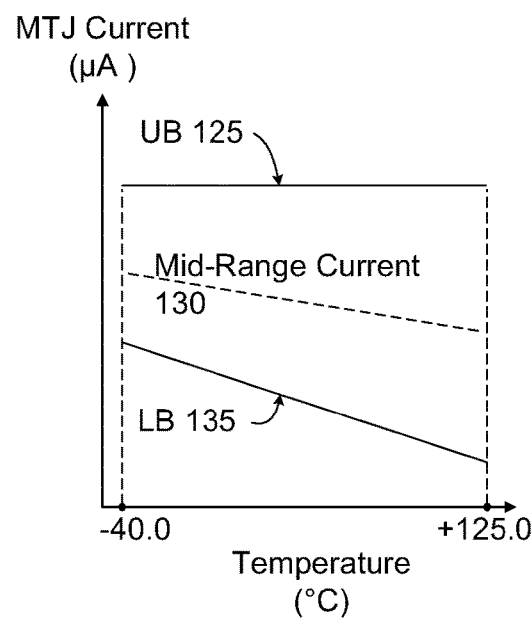
FIG. 1B shows a graph of amplitude versus ambient temperature of a signal utilized to perform a write operation involving a MRAM cell according to various embodiments.

FIG. 1B shows a graph 101 of amplitude versus ambient temperature of a signal utilized to perform a write operation involving a MRAM cell according to various embodiments. As shown in FIG. 1B, a write operation involving a MRAM cell, such as MRAM cell 115 of FIG. 1A, may be accomplished utilizing a current that lies between a lower bound (LB) 135 and upper bound (UB) 125. In the embodiment of FIG. 1B, lower bound 135 and upper bound 125 may comprise signal-versus-temperature limits, within which reliable writing operations, such as to MRAM cell 115 of FIG. 1A, may be conducted. Also as shown in FIG. 1B, lower bound 135 may vary in a manner that is complementary to ambient temperature (CTAT). In this context, the term "CTAT" refers to a characteristic, such as a characteristic of an electrical signal (e.g., an electric current), which varies inversely with an increasing ambient temperature. For example, as shown in FIG. 1B, lower bound 135 is depicted as decreasing with respect to ambient temperature, meaning that a relatively large current may be utilized to bring about storage of a binary logic value within MRAM cell 115 at lower temperatures (e.g., −40.0° C.). FIG. 1B additionally indicates that at higher temperatures (e.g., +125.0° C.) a relatively small current may be utilized to bring about storage of a binary logic value within MRAM cell 115. It should be noted, however, that although lower bound 135 appears to comprise a substantially linear, negative slope, embodiments of claimed subject matter are intended to embrace a wide variety of linear and nonlinear representations (e.g., quadratic, cubic, quartic, exponential, and so forth) of lower bounds of signals utilized to bring about storage of binary logic values within MRAM cell 115. Thus, in particular embodiments, lower bound 135 may be linearly shaped or may be nonlinearly shaped, virtually without limitation, so long as current utilized to perform write operations to MRAM cell 115 tends to decrease, at least over a portion of an ambient temperature range, as the ambient temperature range increases.

As shown in FIG. 1B, upper bound 125 may depict a relatively uniform signal level, so as to indicate substantial invariance of upper bound 125 with respect to an ambient temperature. Accordingly, at relatively low temperatures (e.g., −40.0° C.) performing a write operation to MRAM cell 115 utilizing a signal, such as a signal comprising an electric current, having an amplitude greater than upper bound 125 may bring about damage to the MRAM cell. Additionally, at relatively high temperatures (e.g., +125.0° C.) performing a write operation to MRAM cell 115 utilizing a similar electric current may bring about damage to the MRAM cell. It should be noted, however, that although upper bound 125 appears to depict a substantially invariant relationship between ambient temperature and an electric current that may bring about damage to MRAM cell 115, claimed subject matter is intended to embrace a wide variety of relationships between upper bound 125 and ambient temperature. Accordingly, in particular embodiments, upper bound 125 may depict a linearly-increasing relationship between signal amplitude (e.g., electric current) and ambient temperature, a linearly-decreasing relationship, or a nonlinear (e.g., quadratic, cubic, quartic, exponential, and so forth) relationship, and claimed subject matter is not limited in this respect.

FIG. 1B additionally shows mid-range current profile 130, which, at least in particular embodiments, may correspond to a signal level suitable for use in conducting a write operation to MRAM cell 115 of FIG. 1A. As depicted in FIG. 1B, mid-range current profile 130 may represent a signal amplitude, such as an amplitude of an electric current, which may comprise a suitable margin between signal-versus-temperature limits, such as upper bound 125 and lower bound 135. Accordingly, at least in one particular embodiment, write operations conducted at signal amplitudes proximate with mid-range current profile 130 may safeguard MRAM cell 115 from consuming excess current, which may damage cell 115. Use of mid-range current profile 130 may additionally ensure that write operations are performed utilizing signals, such as electric currents, sufficiently above lower bound 135.

Figure 2A:
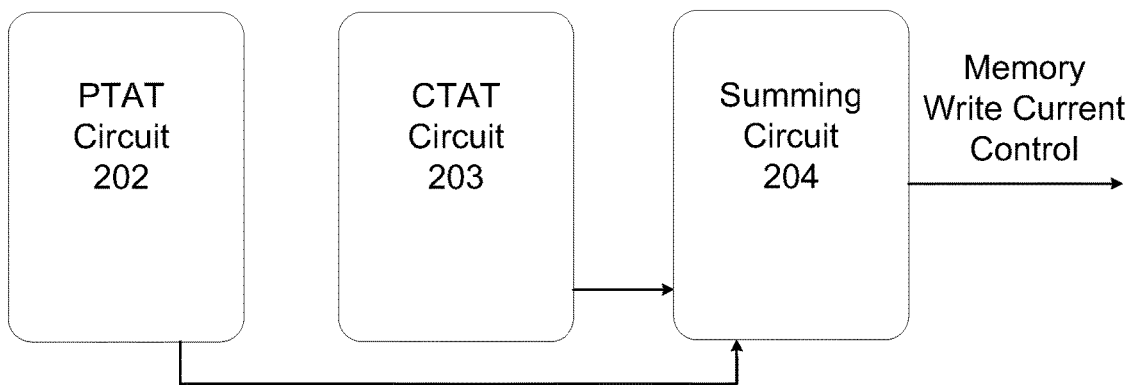
FIG. 2A is a block diagram of a circuit utilized to provide a write signal according to an embodiment.

FIG. 2A is a block diagram 200 of a circuit used to provide a write signal according to an embodiment. In the embodiment of FIG. 2A, PTAT circuit 202 may generate at least one output signal exhibiting a first characteristic proportional to ambient temperature. CTAT circuit 203 may provide at least one output signal exhibiting a second characteristic complementary to ambient temperature. PMOS transistor 250 of summing circuit 204 may generate a combined signal based, at least in part, on signals from PTAT circuit 202 and CTAT circuit 203, wherein the combined signal may exhibit a combined characteristic that is in alignment with the signal-versus-temperature limits, such as limits defined by upper bound 125 and lower bound 135 (of FIG. 1B). In particular embodiments, such as the embodiment of FIG. 2B, a first characteristic (e.g., generated by PTAT circuit 202), a second characteristic (e.g., generated by CTAT circuit 203), and a third characteristic (e.g., generated by summing circuit 204) may correspond to first electrical currents, second electrical currents, and third electrical currents, respectively.

Figure 2B:
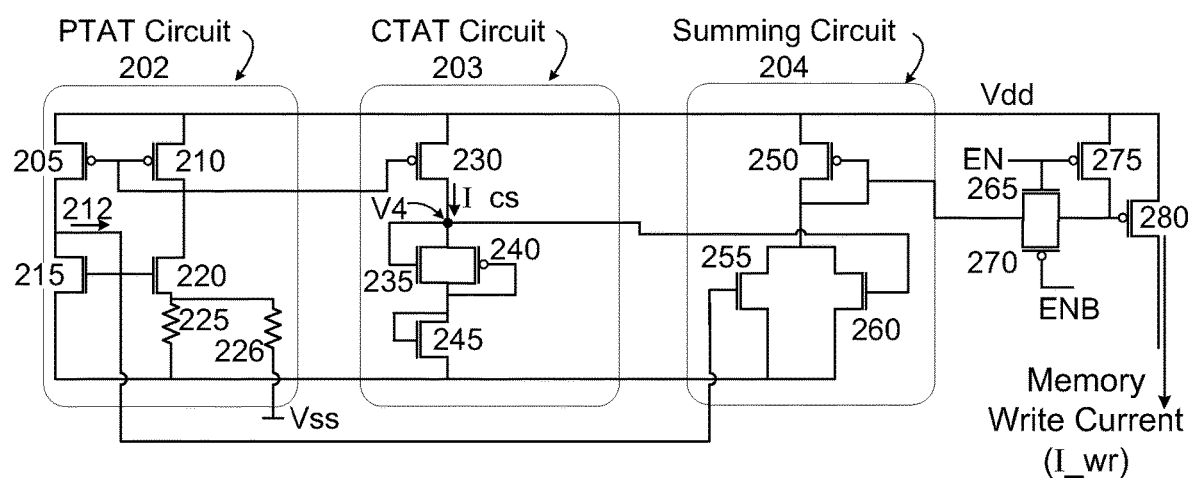
FIG. 2B is a diagram showing a circuit utilized to provide a write signal according to an embodiment.

FIG. 2B is a diagram 201 showing circuits used to provide a write signal according to an embodiment. Thus, in the diagram of FIG. 2B, PTAT circuit 202 may comprise circuitry for generating a first signal that exhibits a first characteristic, wherein the first characteristic corresponds to an electric current, which exhibits a positive correlation with temperature. In this context, the term "PTAT" refers to a characteristic, such as a characteristic of an electrical signal (e.g., an electric current), which is at least positively correlated with ambient temperature. PTAT circuit 202 may comprise PMOS transistors 205 and 210, which may perform a current mirroring function, in which an electric current conducted through PMOS transistor 210 and NMOS transistor 220 may be at least substantially replicated by an electric current conducted through PMOS transistor 205 and 215. Current conduction through transistor 210 may additionally operate to provide a biasing voltage for transistor 230 of CTAT circuit 203. Resistor 225 of PTAT circuit 202 may provide current limiting for current from NMOS transistor 220. Resistor 226 of PTAT circuit 202 may provide a degree of isolation of NMOS transistor 220 from Vss (e.g., a ground potential) as well as performing a current limiting function. In the embodiment of FIG. 2B, as the temperature of PTAT circuit 202 increases, amplitude of an output signal, such as output signal 212, accessed from a location between the source node of PMOS transistor 205 and the drain node of PMOS transistor 215, may also increase. As shown in FIG. 2B, output signal 212 may be conveyed to a gate region of NMOS transistor 255 of summing circuit 204.

FIG. 2B also depicts CTAT circuit 203, which may comprise circuitry for generating a second signal that exhibits a second characteristic, wherein the second characteristic corresponds to an electric current, which varies in a manner that is complementary to ambient temperature. Accordingly, when an ambient temperature of CTAT circuit 203 increases, an output signal, such as a signal present at a source region of NMOS transistor 245, may be coupled to a gate region of NMOS transistor 260 of summing circuit 204. In the embodiment of FIG. 2B, NMOS transistors 255 and 260 may exhibit differing current-conducting capabilities, which may be controlled and/or influenced via control, such as during front-end-of-line fabrication of CMOS devices, over the surface area of NMOS transistor 260 with respect to NMOS transistor 255. Accordingly, in particular embodiments, when PTAT circuit 202 comprises a more significant positive correlation between output signal amplitude and ambient temperature (relative to output signal amplitude of CTAT circuit 203), an increase in surface area of NMOS transistor 260 relative to NMOS transistor 255 may function to emphasize output signals from CTAT circuit 203 with respect to output signals from PTAT circuit 202. In one example, NMOS transistor 260 may comprise twice the surface area of NMOS transistor 255, which may operate to apply a 2:1 weighting function of signals present at a gate region of NMOS transistor 260 in comparison with signals present at a gate region of NMOS transistor 255.

FIG. 2B also depicts N-diode 235, which may comprise a diode-connected NMOS transistor, and P-diode 240, which may comprise a diode-connected PMOS transistor. In the embodiment of FIG. 2B, such parallel connection of N-diode 235 and P-diode 240, in contrast to a series arrangement of N-diode 235 and P-diode 240 may operate to reduce a voltage drop of current I_cs from transistor 230. Additionally, parallel connection of N-diode 235 and P-diode 240 may maintain electrical current conduction through N-diode 235 when P-diode 240 is unable to provide conduction of a significant electrical current. Thus, for devices fabricated at SF process corners, such as a process corner in which Vt (turn-on voltage) varies between N-diode 235 and P-diode 240, the parallel combination of N-diode 235 and P-diode 240 may give rise to a relatively consistent value for current I_cs.

In particular embodiments, PMOS transistor 210 of PTAT circuit 202 provides a signal varying proportionally with ambient temperature. However, in certain embodiments, transistor 210 provides a PTAT signal, such as an electric current, that comprises a temperature coefficient less than the inherent turn-on voltage ($V_t$) corresponding to a voltage drop across the parallel combination of N-diode 235 and P-diode 240 in series with NMOS transistor 245. Thus, responsive to the turn-on voltage of the transistor of P-diode 240 at −40.0° C. comprising a greater value than the turn-on voltage of the transistor of P-diode 240 at +125.0° C., the drain region of PMOS transistor 230 (at node V4) may comprise a CTAT voltage. When the CTAT voltage at node of V4 is utilized to drive a gate region of an NMOS transistor, an electric current conducted through NMOS transistor 245 may be expressed the variables of expression (1) below:

$$\frac{1}{\mu}, (\sim V_{ov} = V_{\mathit{eff}}), V_{TH} \quad (1)$$

In expression (1), $\mu$ corresponds to the electron mobility of the NMOS transistor. Accordingly, the term $$\frac{1}{\mu},$$

implies that current conducted through the NMOS transistor is inversely proportional to electron mobility. Expression (1) also identifies $V_{OV}$, which may correspond to an overdrive voltage of NMOS transistor 245, which may correspond to $V_{GS}$-$V_{TH}$, in which $V_{GS}$ corresponds to a voltage applied to a gate region of NMOS transistor 245, and in which $V_{TH}$ corresponds to the threshold voltage of NMOS transistor 245.

Returning to FIG. 2B, responsive to the parallel combination of N-diode 235 and P-diode 240 in series with NMOS transistor 245 providing a voltage drop of $2V_{GS}$, compensation of a first voltage drop of $V_{GS}$ (of the voltage drop of $2V_{GS}$) may occur via the coupling of the gate region of the transistor of N-diode 235 with the drain region of PMOS transistor 230. The remaining $V_{GS}$ (of the voltage drop of $2V_{GS}$) may be adjusted so as to exhibit CTAT behavior utilizing a relatively large channel width versus length ratio (W/L). In particular embodiments, for relatively large values of W/L, $V_{GS}$ comprises a value similar to that of $V_t$ (e.g., $V_{GS} \approx V_t$). Accordingly, CTAT circuit 203 may generate an electric current that is complementary to ambient temperature.

FIG. 2B also depicts summing circuit 204, which may operate to sum or to combine characteristics, wherein such characteristics may relate to electric currents generated by PTAT circuit 202 and CTAT circuit 203. Responsive to summation of electric currents from PTAT circuit 202 and from CTAT circuit 203, summing circuit 204 may provide a signal to the parallel combination of NMOS transistor 265 and PMOS transistor 270. Responsive to write enable (EN) signal comprising a relatively low level (e.g., active low) and a complement of write enable signal (ENB) comprising a relatively high level (e.g., active high), an electric current (I_wr) may be conducted through PMOS transistor 280. Accordingly, memory write current (I_wr) may be made available for performing write operations to MRAM cells, such as MRAM cell 115 of FIG. 1A.

Figure 3:
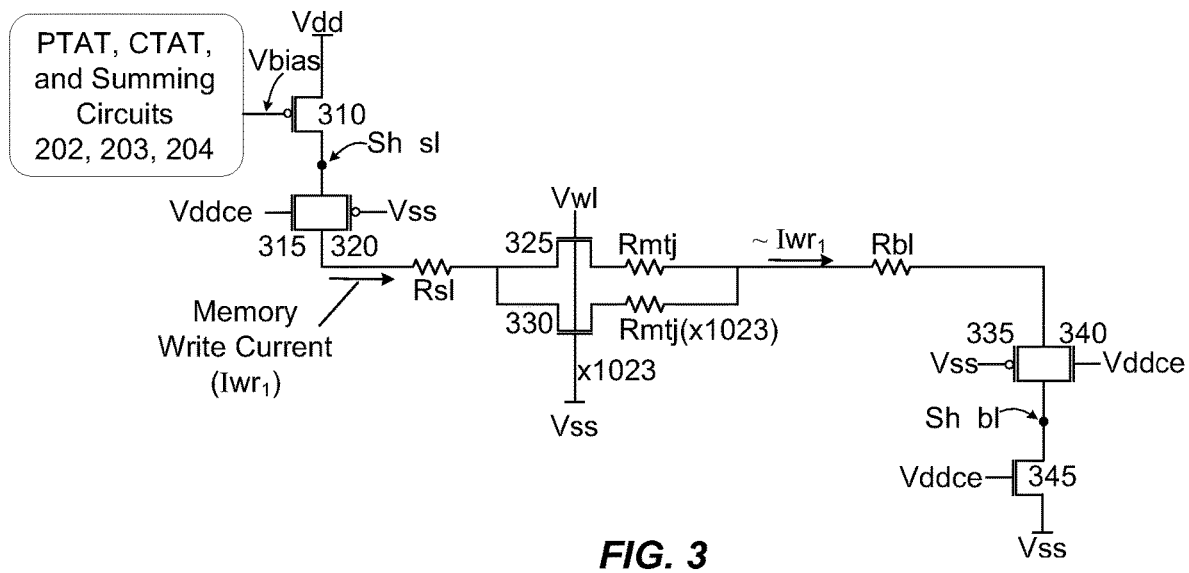
FIG. 3 is a circuit diagram showing a write path utilized to conduct a first write operation involving a MRAM cell according to an embodiment.

FIG. 3 is a circuit diagram 300 showing a write path utilized to conduct a first MRAM operation according to an embodiment. As depicted in FIG. 3, PTAT circuit 202, CTAT circuit 203, and summing circuit 204 may be coupled to PMOS transistor 310, which may operate to control current conducting through node Sh_sl from Vdd and through resistive memory elements, such as resistive memory element Rmtj in FIG. 3. It should be noted that Rmtj (of FIG. 3 and FIG. 4) may represent any resistive memory type, such as resistive memory elements of a MRAM (e.g., a MTJ), or may represent any other type of resistive memory, such as correlated electron random-access memory (CERAM), phase change memory (PCM), ferroelectric random-access memory (FERAM), and so forth, and claimed subject matter is not limited in this respect.

In FIG. 3, responsive to a gate voltage (Vbias) of PMOS transistor 310 comprising, for example, a reference value (e.g., Vss), current may conduct through PMOS transistor 310, such as the current conducting through node Sh_sl and through the parallel combination of NMOS transistor 315 and PMOS transistor 320. In the embodiment of FIG. 3, such parallel connection of NMOS transistor 315 and PMOS transistor 320 may operate to reduce a voltage drop below node Sh_sl, which may correspond to the drain region of PMOS transistor 310. Additionally, the parallel combination of NMOS transistor 315 and PMOS transistor 320 may maintain electrical current conduction through NMOS transistor 315 when PMOS transistor 320 is unable to provide conduction of sufficient electrical current. Thus, for devices fabricated at SF process corners, such as a process corner in which Vt (turn-on voltage) varies between NMOS transistor 315 and PMOS transistor 320, the parallel combination of the NMOS and PMOS transistors may to give rise to a relatively stable voltage value at a node Sh_sl.

Responsive to conduction of memory write current $Iwr_1$ through the parallel combination of NMOS transistor 315 and PMOS transistor 320, current $Iwr_1$ may conduct through resistance Rsl, which may correspond to parasitic resistance exhibited by a metal source line (SL). As shown in FIG. 3, a word line select signal (Vwl) applied to a gate region of NMOS transistor 325 may permit memory write current $Iwr_1$ to conduct through a resistive memory device, which may comprise a MTJ device, as indicated by Rmtj. In addition, responsive to applying a reference potential (e.g., Vss) or other negligible potential to a gate region of NMOS transistor 330, an insignificant or negligible current may be conducted through NMOS transistor 330. Thus, in one instance, if resistive memory elements (as indicated by Rmtj) are arranged to in an array, such as an array of 1024 elements, a significant write current, such as $Iwr_1$ may conduct through Rmtj while insignificant or negligible currents are conducted through the remaining 1023 resistive memory elements of the array and through transistors similar to NMOS transistor 330. Following conduction of at least a substantial portion of current $Iwr_1$ through Rmtj, current $Iwr_1$ may be conducted through resistance Rbl, which may correspond to a relatively small parasitic resistance exhibited by a metal bit line of a selected resistive memory element, and through the parallel combination of PMOS transistor 335 and NMOS transistor 340. $Iwr_1$ may then be conducted through a shared bit line node, as indicated by Sh_bl, and through transistor 345 to a reference potential (Vss).

Figure 4:
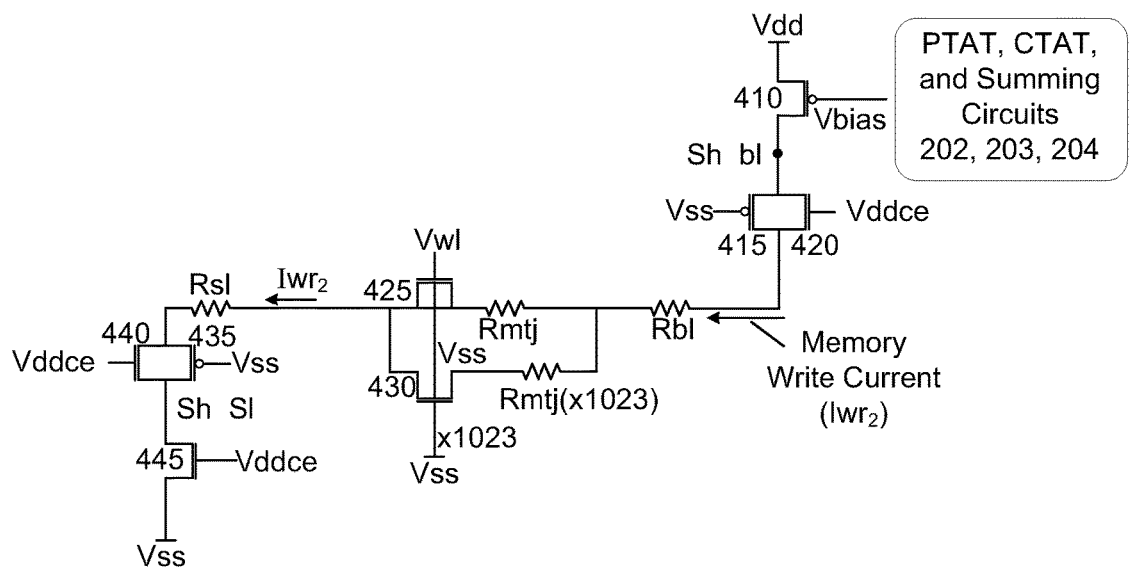
FIG. 4 is a circuit diagram showing a write path utilized to conduct a second write operation involving a MRAM cell according to an embodiment.

FIG. 4 is a circuit diagram 400 showing a write path utilized to conduct a second MRAM write operation according to an embodiment. It should be noted that the memory write path depicted in FIG. 4 may correspond to a separate memory write path than the memory write path depicted in FIG. 3. In certain embodiments, such separation of memory write paths may permit differing signal amplitudes, such as amplitudes of current signals, to be utilized for particular types of resistive memory state changes. In one instance, for resistive memory write operations involving MTJ elements, a first current may be utilized to perform a write operation to transition a MTJ element from a first state, in which magnetization vectors of first and second localized regions are oriented parallel to each other, to a second state, in which magnetization vectors of the first and second localized regions are oriented antiparallel to each other (e.g., paralle- 1→antiparallel). Such first current may be larger than a second current, which may be utilized to perform an operation to transition a MTJ element from the second state, in which magnetization vectors are located antiparallel to each other, to a first state, in which magnetization vectors of first and second localized regions are oriented parallel to each other (e.g., antiparallel→parallel). In certain embodiments, the circuit depicted in FIG. 4 may be suitable for performing a write operation in which magnetization vectors of first and second localized regions of a MTJ element are transitioned from comprising orientations antiparallel with respect to each other to comprising orientations parallel with respect to each other (e.g., antiparallel→parallel). Likewise, in certain embodiments, the circuit depicted in FIG. 3 may be suitable for performing write operations in which magnetization vectors of first and second localized regions of a MTJ element are transitioned from comprising orientations parallel with respect to each other to comprising orientations antiparallel with respect to each other (e.g., parallel antiparallel).

In FIG. 4, responsive to a gate voltage (Vbias) of PMOS transistor 410 comprising a reference value (e.g., Vss), a current may conduct through PMOS transistor 410 and through node Sh_bl. Such current may conduct through the parallel combination of PMOS transistor 415 and NMOS transistor 420. It may be appreciated that, for particular embodiments, in view of larger memory write currents being utilized to perform a write operation to transition a MTJ element from a state in which magnetization vectors of first and second layers are aligned parallel to each other to a state in which magnetization vectors of first and second layers are aligned antiparallel to each other (e.g., parallel→antiparallel) PMOS transistor 410 may be fabricated so as to consume smaller surface area than PMOS transistor 310 of FIG. 3.

In FIG. 4, such parallel connection of PMOS transistor 415 and NMOS transistor 420 may operate to reduce a voltage drop below node Sh_bl. Additionally, the parallel connection of PMOS transistor 415 and NMOS transistor 420 may maintain electrical current conduction through PMOS transistor 415 when NMOS transistor 420 is unable to provide conduction of sufficient electrical current. Thus, for devices fabricated at SF process corners, such as a process corner in which Vt (turn-on voltage) varies between PMOS transistor 415 and NMOS transistor 420, the parallel combination of PMOS transistor 415 and NMOS transistor 420 may operate to provide a relatively stable voltage value at a node Sh_sl.

Current $Iwr_1$ may conduct through resistance Rbl, which may correspond to a relatively small parasitic resistance exhibited by the bit line of resistive memory element Rmtj. As shown in FIG. 4, word line select signal (Vwl) applied to a gate region of NMOS transistor 425 may permit memory write current $Iwr_2$ to conduct through a resistive memory element, which may comprise a MTJ device, as indicated by Rmtj. In addition, responsive to applying a reference potential or other negligible potential to a gate region of NMOS transistor 430, an insignificant or negligible current may be conducted through NMOS transistor 430. Thus, in one instance, if resistive memory elements (as indicated by Rmtj) are arranged in an array, such as an array of 1024 elements, substantially all of memory write current $Iwr_2$ may conduct through Rmtj while insignificant or negligible currents are conducted through the remaining 1023 resistive memory elements of the array and through transistors similar to NMOS transistor 430. Write current $Iwr_2$ (as depicted by $Iwr_2$) may be conducted through resistance Rbl, which may correspond to a relatively small parasitic resistance exhibited by a metal bit line of a selected resistive memory element, and through the parallel combination of P-diode 435 and N-diode 440. $Iwr_2$ may then be conducted through a shared select line node, as indicated by Sh_sl, and through transistor 445 to a reference potential (Vss).

Figure 5A:
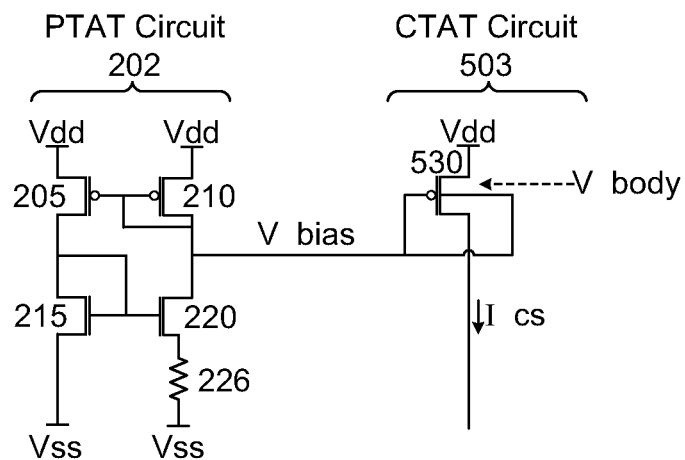
FIG. 5A is a circuit diagram showing body-biasing of a component utilized to perform a write operation involving a MRAM according to an embodiment.

FIG. 5A is a circuit diagram 500 showing body-biasing of a component utilized to perform a write operation involving a MRAM cell according to an embodiment. In FIG. 5, a portion of PTAT circuit 202 has been reproduced. However in FIG. 5, V_bias has been coupled from a node corresponding to the drain region of PMOS transistor 210 to a location corresponding to the bulk material of PMOS transistor 530 of CTAT circuit 503. In particular embodiments, such body-biasing may operate to control or limit the turn-on voltage (Vt) of PMOS transistor 530. In certain embodiments, when V_body<Vdd, a forward body-bias may be applied to PMOS transistor 530. Such application of body-biasing to PMOS transistor 530 may be adjusted according to the voltage and temperature parameters of particular process corners. More particularly, the signal amplitude of V_bias may exhibit a dependency on the FF process corner, which may comprise a higher voltage than exhibited at process corner TT. Accordingly, body-biasing of PMOS transistor 530 may be slightly reduced. Further, a SS process corner may exhibit a lower voltage than a TT process corner. Thus, in turn, current of signal V_body may remain proximate with currents exhibited at a TT process corner.

In FIG. 5A, variations in current conduction for different process corners may be achieved, dependent upon whether PMOS 530 is body-biased utilizing, for example, Vdd when compared to V_bias generated by PTAT circuit 202. In Table I, below, for various process corners, variation in I_cs for different values of body-biasing is provided:

TABLE I

| I_cs @ 1.8 V (Vdd, at 25.0° C.) | Body-Biasing (Vdd) | Body-Biasing (V_bias) |
|---|---|---|
| SS, 25 | 60.1 µA | 67.5 µA |
| TT, 25 | 63.7 µA | 66.5 µA |
| FF, 25 | 68.0 µA | 66.0 µA |
| Spread | 12.61% | 2.67% |

Accordingly, Table I shown that less variation in current I_cs may result from body-biasing of PMOS transistor 530 utilizing V_bias from PTAT circuit 202 rather than utilizing supply voltage, such as Vdd.

Figure 5B:
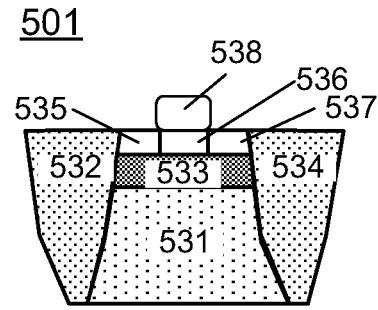
FIG. 5B is a diagram of a depleted silicon-on-insulator transistor component, which may be utilized in the circuit of FIG. 5A according to an embodiment.

FIG. 5B is a diagram of a depleted silicon-on-insulator transistor component 501, which may be utilized in the circuit of FIG. 5A according to an embodiment. In FIG. 5B, oxide layer 533, which may comprise a layer of silicon dioxide, for example, may be formed on or over substrate 531. Source region 535, which may be placed in contact with metal region 532, may operate to supply carriers, such as electrons, which may conduct through undoped region 536 to drain region 537 and to metal region 534. Applying a signal, such as a voltage signal, to gate region 538 may be utilized to control conduction of carriers through undoped region 536.

Thus, in particular embodiments, depleted silicon-on-insulator transistor component 501 may provide a body-biasing technique, which may operate in place of PMOS transistor 530 of FIG. 5A. Further, based, at least in part, on undoped region 536 comprising a relatively small thickness, such as a thickness of between about 5.0 nm and about 10.0 nm, greater control may be provided over Vt than can be provided via body-biasing of PMOS transistor 530. Accordingly, particular embodiments of claimed subject matter may utilize the depleted silicon-on-insulator transistor structure of FIG. 5B in lieu of PMOS transistor 530.

Figure 6:
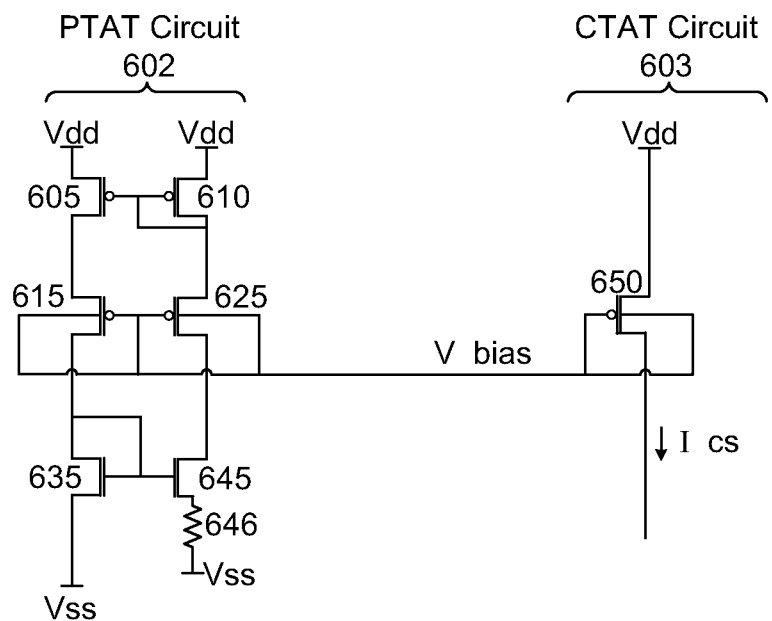
FIG. 6 is a circuit diagram showing body-biasing of a component utilized to perform a write operation involving a MRAM according to another embodiment.

FIG. 6 is a circuit diagram 600 showing body-biasing of a component utilized to perform a write operation involving a MRAM according to another embodiment. In the embodiment of FIG. 6, PMOS transistors 605 and 610, body-biased PMOS transistors 615 and 625, and NMOS transistors 635 and 645 may be arranged to form a cascode configuration in which resistor 646 may operate to limit current conduction between NMOS transistor 645 and Vss (which may comprise a reference potential). In such an arrangement, a voltage drop, such as across PMOS transistor 610 and body-biased PMOS transistor 625, for example, may comprise a value of twice the turn-on voltage (Vt) of transistor 610 and 625. Accordingly, V_bias may vary in a manner that is complementary to ambient temperature based, at least in part, on Vgs−Vt comprising a dependency on Vt, which varies in a manner complementary to ambient temperature. Thus, in FIG. 6, utilization of adaptive body-biasing brings about greater control over output signal variability at a SS process (low-voltage) corner. However, responsive to two diode voltage drops in series (e.g., brought about from PMOS transistor 610 and PMOS transistor 625), when adaptive body-biasing is utilized, significant process insensitivity to low-voltage process corners (SS) can be achieved.

Figure 7:
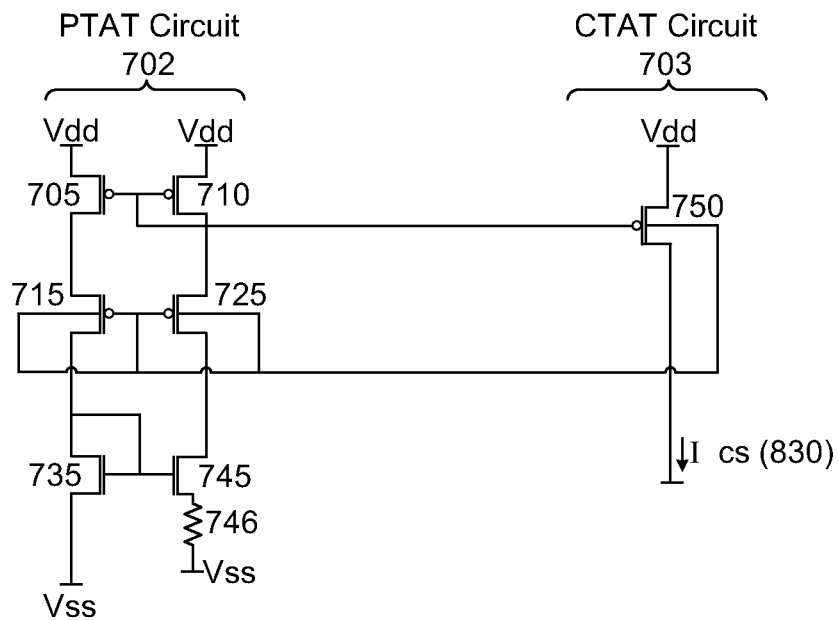
FIG. 7 is a circuit diagram showing body-biasing of a component utilized to perform a write operation involving a MRAM according to another embodiment.

FIG. 7 is a circuit diagram 700 showing body-biasing of a component utilized to perform a write operation involving a MRAM according to another embodiment. As shown in FIG. 7, the gate region of PMOS transistor 750 may be coupled to gate regions of PMOS transistors 705 and 710 of PTAT circuit 702. In addition, PMOS transistor 750 of CTAT circuit 703 is depicted as body-biased via coupling of the body of PMOS transistor 750 to gate regions of PMOS transistors 715 and 725 of PTAT circuit 702. NMOS transistors 735 and 745, in combination with resistor 746, may operate to provide isolation between a reference voltage (e.g., Vss) of PMOS transistors 715 and 725. It may be appreciated that the gate region of PMOS transistor 750 may be more tightly controlled than the body-biasing of PMOS transistor 750. Thus, with respect to magnitudes of signals present at the gate region of PMOS transistor 750 and the body-biasing of PMOS transistor 750, when PMOS transistor 750 is body-biased by an amount lower than a voltage applied at the gate region of PMOS transistor 750, an outcome of such body-biasing may bring about substantial control (such as reduction or even cancellation) of the impact on the turn-on voltage of PMOS transistor 750. Accordingly, the PTAT effect of PTAT circuit 702 can be substantially reduced or eliminated entirely. Hence, I_cs (830) may exhibit substantial temperature invariance, such as variance in amplitude of less than 20.0% over an operating temperature range of about −40.0° C. to about +125.0° C., as shown in FIG. 8.

Figure 8:
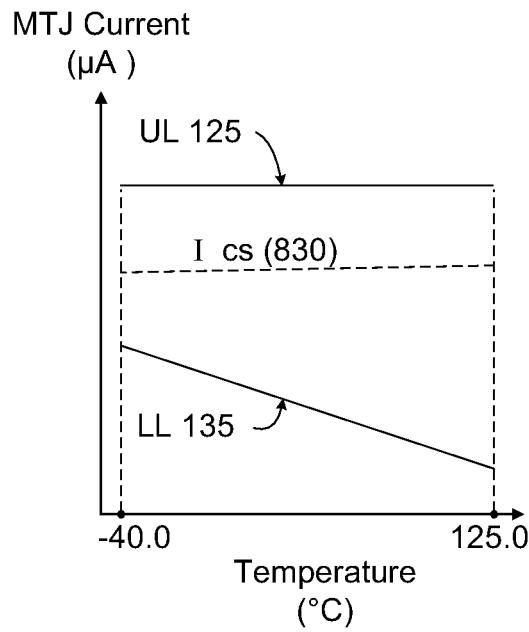
FIG. 8 shows a graph of signal level versus ambient temperature of the circuit of FIG. 7 according to an embodiment.

FIG. 8 shows a graph 800 of signal level versus ambient temperature of the circuit of FIG. 7 according to an embodiment. As shown in FIG. 8, responsive to arrangement of NMOS and PMOS transistors of PTAT circuit 702, signal profile I_cs indicates substantial invariance with respect to ambient temperature within the range of about −40.0° C. to about +125.0° C.

Figure 9:
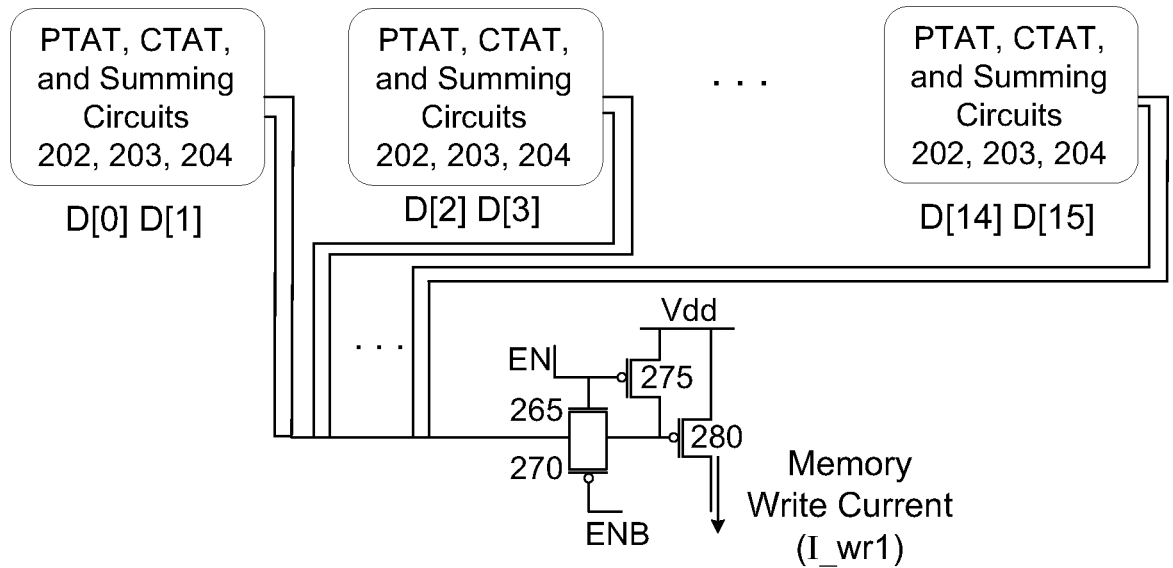
FIG. 9 shows an arrangement of circuits similar to those of FIG. 1B to generate write signals through separate memory write paths according to an embodiment.

FIG. 9 shows an arrangement 900 of circuits similar to those of FIG. 1 to generate write signals through separate memory write paths according to an embodiment. Thus, as indicated in FIG. 9, for each two bit memory instance (e.g., D[0], D[1]), a complement of PTAT circuit 202, CTAT circuit 203, and summing circuit 204 may be replicated.

Each complement of PTAT circuit 202, CTAT circuit 203, and summing circuit 204 may be grouped so as to provide control over memory write current I_wr, as well as additional memory write currents, such as by way of PMOS transistors 265, 270, 275, and 280, as previously described herein.

Figure 10:
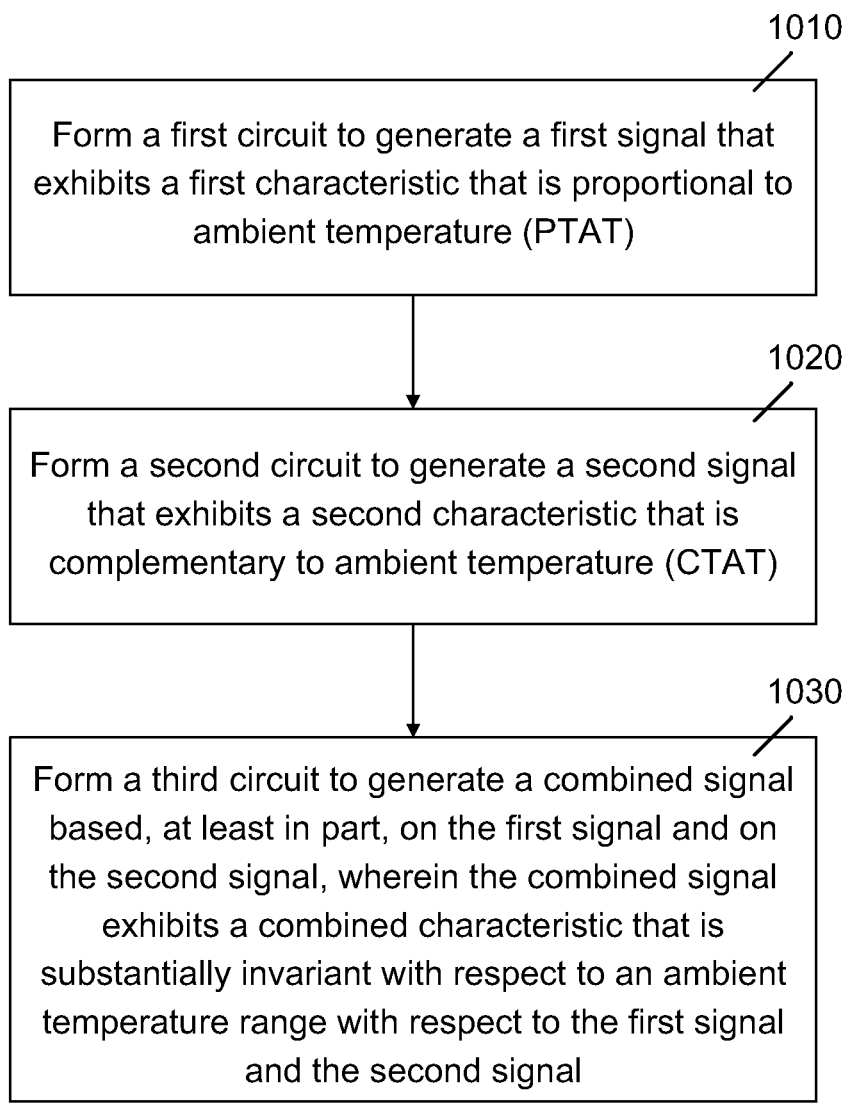
FIG. 10 is a flow chart for a method of fabricating a circuit according to various embodiments.

FIG. 10 is a flow chart for a method of fabricating a circuit according to various embodiments. FIG. 10 may include blocks in addition to those shown and described, fewer blocks or blocks occurring in an order different than may be identified, or any combination thereof. The method of FIG. 10 may begin at block 1010, which may comprise forming a first circuit to generate a first signal that exhibits a first characteristic that is proportional to ambient temperature. In particular embodiments, a first characteristic of a signal generated by a first circuit may comprise an electric current, although claimed subject matter is not limited in this respect. The method of FIG. 10 may continue at block 1020, which may comprise forming a second circuit to generate a second signal that exhibits a second characteristic that is complementary to ambient temperature.

Block 1020 may comprise forming a second circuit comprising a PMOS transistor that is body-biased utilizing a signal having in amplitude of Vdd. In another embodiment, a PMOS transistor of the second circuit may be body-biased utilizing a different value, such as V_body<Vdd, which may forward bias a PMOS transistor of a CTAT circuit. Such forward biasing of a PMOS transistor of a CTAT circuit may control variability or spread of a signal, such as a current signal, generated by a CTAT circuit. In another embodiment, block 1020 may comprise forming a depleted silicon-on-insulator transistor component, which may provide a body-biasing technique in lieu of body-biasing of a PMOS transistor of a CTAT circuit. In yet another embodiment, block 1020 may comprise coupling a gate region of a PMOS transistor of a CTAT to a gate region of one or more PMOS transistors of a PTAT circuit while body-biasing a PMOS transistor of a CTAT circuit via the PMOS transistor to one or more gate regions of PMOS transistors of a PTAT circuit.

The method of FIG. 10 may continue at block 1030, which may comprise forming a third circuit to generate a combined signal based, at least in part, on the first signal and on the second signal. At block 1030, the combined signal may exhibit a combined characteristic that is substantially invariant with respect to the first signal and the second signal over an ambient temperature range, such as depicted by signal profile I_cs of FIG. 8.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A circuit, comprising:
 a first circuit to generate a first signal that exhibits a first characteristic that is proportional to ambient temperature (PTAT);
 a second circuit to generate a second signal that exhibits a second characteristic that is complementary to ambient temperature (CTAT); and a third circuit to receive the first and second signals at a same time and generate a combined signal by summation of the first signal and the second signal, wherein the combined signal exhibits a combined characteristic that is in alignment with a signal-versus-temperature limit of a resistive memory cell.

2. The circuit of claim 1, wherein the second circuit comprises at least one PMOS transistor having a fully depleted layer of silicon-on-insulator (FDSOI).

3. The circuit of claim 1, wherein at least one of the first characteristic, the second characteristic, and the combined characteristic comprise electric current.

4. The circuit of claim 3, wherein the third circuit exhibits a capability to conduct an electric current generated by the second circuit that is weighted with respect to an electric current generated by the first circuit.

5. The circuit of claim 1, wherein the combined signal varies by less than about 20.0% over a temperature range of about −40.0° C. to about +125.0° C.

6. The circuit of claim 1, wherein the second circuit to generate the second signal comprises a parallel combination of an N-diode and a P-diode, wherein the parallel combination is coupled to an output node of the second circuit.

7. The circuit of claim 1, wherein the signal-versus-temperature limit of the resistive memory cell corresponds to an upper current limit or a lower current limit, wherein a write operation occurs between the upper current limit and the lower current limit.

8. The circuit of claim 7, wherein the resistive memory cell comprises a magnetic random-access memory (MRAM) cell.

9. The circuit of claim 8, wherein the MRAM cell comprises a magnetic tunneling junction (MTJ) cell.

10. The circuit of claim 8, wherein the MRAM is coupled to the third circuit through at least two write paths.

11. A circuit, comprising:
a summing circuit to obtain:
a first input signal from a first circuit that generates an electric current that varies proportionally to ambient temperature, and
a second input signal from a second circuit that generates an electric current that varies complementary to ambient temperature,
wherein the summing circuit:
generates a write signal to a memory cell based on a combination of the first and second input signals, and
applies a weighting function to control a proportionate impact of the first signal with respect to the second signal on the generation of the write signal.

12. The circuit of claim 11, wherein the summing circuit additionally applies a weighting function of the input signal from the second circuit with respect to the input signal from the first circuit.

13. The circuit of claim 11, wherein the memory cell comprises a magnetic random-access memory (MRAM) cell.

14. The circuit of claim 13, wherein the MRAM cell comprises a magnetic tunneling junction (MTJ) cell.

15. The circuit of claim 11, wherein the second circuit comprises a parallel combination of an N-diode and a P-diode, wherein the parallel combination is coupled to an output node of the second circuit.

16. The circuit of claim 11, wherein the second circuit comprises at least one PMOS transistor having a fully depleted layer of silicon-on-insulator (FDSOI).

17. The circuit of claim 11, wherein the second circuit comprises at least one PMOS transistor that is adaptively body-biased.

18. A method of fabricating a circuit, comprising:
forming a first circuit to generate a first signal that exhibits a first characteristic that is proportional to ambient temperature (PTAT);
forming a second circuit to generate a second signal that exhibits a second characteristic that is complementary to ambient temperature (CTAT); and
forming a third circuit to receive the first and second signals at a same time and generate a combined signal by summation of the first signal and the second signal, wherein the combined signal exhibits a combined characteristic that is substantially invariant over an ambient temperature range.

19. The method of claim 18, further comprising forming one or more instances of magnetic random-access memory (MRAM) cells for coupling to the third circuit to generate the combined signal.

20. The method of claim 18, wherein forming the second circuit to generate the second signal comprises forming a parallel combination of an N-diode and a P-diode, wherein the parallel combination is coupled to an output node of the second circuit.

* * * * *